(12) United States Patent
Min et al.

(10) Patent No.: US 8,221,583 B2
(45) Date of Patent: Jul. 17, 2012

(54) SYSTEM FOR PEELING SEMICONDUCTOR CHIPS FROM TAPE

(75) Inventors: Gab Yong Min, Ichon-Si (KR); Dong Hyong Lee, Ichon-si (KR); Jung Ho Kim, Yuju-gun (KR); SeungYun Ahn, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 704 days.

(21) Appl. No.: 12/018,065

(22) Filed: Jan. 22, 2008

(65) Prior Publication Data
US 2008/0173407 A1 Jul. 24, 2008

Related U.S. Application Data

(60) Provisional application No. 60/885,889, filed on Jan. 20, 2007.

(51) Int. Cl.
*B32B 38/10* (2006.01)
(52) U.S. Cl. ........ 156/707; 156/716; 156/758; 156/765; 156/932; 156/943; 438/464

(58) Field of Classification Search .................. 156/344, 156/584, 707, 716, 758, 765, 932, 943; 438/464, 438/976
See application file for complete search history.

(56) References Cited

U.S. PATENT DOCUMENTS

| | | | |
|---|---|---|---|
| 4,472,218 A | 9/1984 | Avedissian et al. | |
| 4,627,787 A | 12/1986 | Bond et al. | |
| 4,759,675 A | 7/1988 | Bond et al. | |
| 6,544,819 B2 | 4/2003 | Odajima et al. | |
| 6,585,471 B2 | 7/2003 | Odajima et al. | |
| 6,658,718 B2 * | 12/2003 | Farnworth et al. | 29/559 |
| 7,238,258 B2 | 7/2007 | Park et al. | |
| 2003/0075271 A1* | 4/2003 | Yoshimoto et al. | 156/344 |
| 2006/0166466 A1 | 7/2006 | Maki et al. | |
| 2007/0277929 A1* | 12/2007 | Trinks et al. | 156/344 |
| 2008/0227239 A1* | 9/2008 | Shibata et al. | 438/110 |

* cited by examiner

*Primary Examiner* — Mark A Osele
(74) *Attorney, Agent, or Firm* — Ishimaru & Associates LLP; Mikio Ishimaru; Stanley Chang

(57) ABSTRACT

A semiconductor system for peeling semiconductor chips from tape, comprising: providing an outer housing having an aperture on a top thereof; providing a magnet with a needle base extension; providing needles magnetically held to the magnet; applying a vacuum through the aperture to hold an adhesive material to the outer housing; and extending the needles through the aperture in the outer housing.

20 Claims, 16 Drawing Sheets

SYSTEM FOR PEELING SEMICONDUCTOR CHIPS FROM TAPE

CROSS-REFERENCE TO RELATED APPLICATION

This application claims the benefit of U.S. Provisional Patent Application Ser. No. 60/885,889 filed Jan. 20, 2007.

TECHNICAL FIELD

The present invention relates generally to semiconductors and more particularly to a system for semiconductor processing.

BACKGROUND ART

With virtually all electronic products, there has been a consistent if not increasing demand for new features, higher speed, more data, improved portability, etc. These demands have driven the development of electronic technology including reducing size, improving utility, or increasing performance of the integrated circuit devices contained within an ever-increasing range of electronic products such as cell phones, music players, televisions, or automobiles.

As electronic products have become an integral part of our daily lives, many electronic products with complex integrated circuits are commonly used often without end users' cognizance of the underlying electronic technology. Even for products that include obvious electronic technology, the technology itself is often taken for granted exacerbating the demands for improvements.

In the fabrication of semiconductor chips, multiple chips are commonly fabricated simultaneously together on a large wafer. When the wafer is completed, it is then necessary to separate, or "singulate", the individual chips from one another. One typical process for singulating the chips is to cut the wafers with precision diamond saws that isolate the individual chips from one another by the width of the saw. To protect the chips and the wafer during this singulation process, an adhesive tape is commonly first applied to a surface of the wafer, generally to the bottom surface.

Following singulation, it is then necessary to remove the chips individually from the adhesive tape. Unfortunately, as technological advances have continuously reduced the dimensions and thicknesses of chips, they have become increasingly fragile and subject to cracking during removal from the adhesive tape. Thus, product losses have been continually increasing, whereas competitive pressures for lower prices and increased production efficiency have made such product losses ever increasingly intolerable.

Various solutions have been attempted to mitigate this problem. For example, careful adjustments have been made to the adhesive strength of the tape to reduce the tape holding force on the chip to just the minimum that is feasible. However, the tape holding force must be sufficient to secure the chips during the singulation sawing process. With the ever-accelerating reduction in chip sizes and thicknesses, it is ever more and more difficult to lift or pull the individual chips off the adhesive tape without cracking the chips, regardless of the adhesive strength. This is particularly true, for example, for conventional peeling methods such as those that use needles to push the chips off the adhesive tape.

Unfortunately, therefore, as the chips become ever thinner (for example, below 125 μm thickness), the chips become ever more vulnerable to random chip cracking during chip peeling from the tape. This renders the chips unavailable for subsequent bonding to upcoming production objects such as printed circuit boards, substrates, leadframes, and so forth. This makes production delays and losses even worse.

Despite the advantages of recent developments in integrated circuit manufacturing, there is a continuing need for improving fixed needle height mismatches and pickup level mismatches such as mismatches resulting from needle holder ruptures for singulation processes.

Thus, a need still remains for significant improvements in systems for peeling singulated semiconductor chips from tape during the fabrication thereof. In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an outer housing having an aperture on a top thereof; providing a magnet with a needle base extension; providing needles magnetically held to the magnet; applying a vacuum through the aperture to hold an adhesive material to the outer housing; and extending the needles through the aperture in the outer housing.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
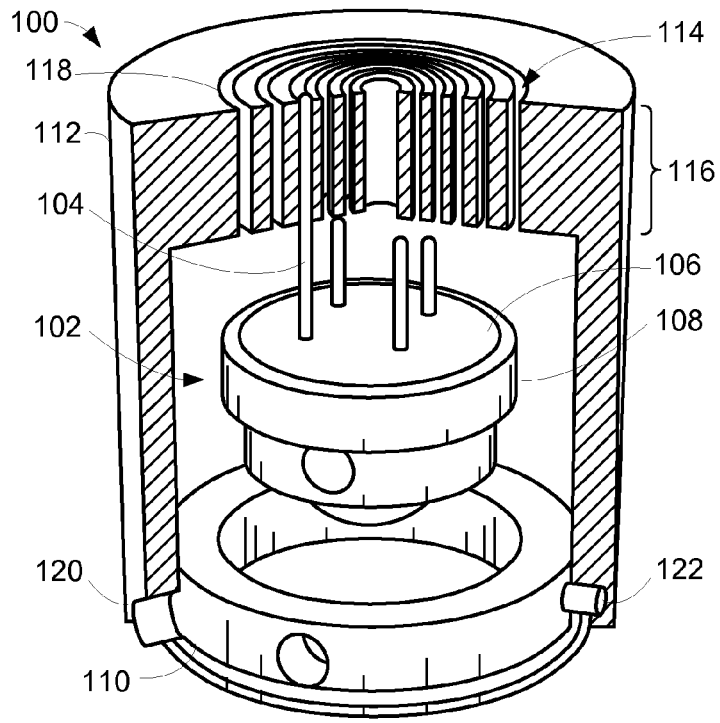
FIG. 1 is an isometric view with a partial cutaway of a semiconductor system for peeling semiconductor chips from tape in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown an isometric view with a partial cutaway of a semiconductor system 100 for peeling semiconductor chips from tape in a first embodiment of the present invention. The semiconductor system 100 for peeling semiconductor chips from tape preferably includes a magnetic needle base 102 such as a permanent magnetic holder. Needles 104 can be assembled over the magnetic needle base 102 in an array predetermined by a planar dimension of a device (not shown) such as an integrated circuit.

The magnetic needle base 102 can include a magnet 106 such as a permanent magnet over a magnet housing 108. The magnet housing 108 with the magnet 106 can provide a substantially fixed and substantially planar horizontal position as well as vertical movement of the needles 104. The vertical movement of the needles 104 over the magnetic needle base 102 can provide lifting or stretching of an adhesive material (not shown) under the device resulting in peeling or removal of the adhesive material from the device.

The magnetic needle base 102 can be formed over a base housing 110 providing a substantially fixed base from which the magnetic needle base 102 can move vertically. The base housing 110 can provide guidance, registration, or a reference for the vertical movement of the magnetic needle base 102. The base housing 110 can be formed to provide substantially vertical movement of the magnetic needle base 102 minimizing horizontal movement.

An outer housing 112 shown with a portion cutaway can be formed over the magnetic needle base 102. The outer housing 112 preferably includes apertures 114 providing guidance, registration, or a reference for movement of the needles 104. The needles 104 can move vertically through the apertures 114 formed substantially vertically providing an opening through a top of the outer housing 112 from an interior to an external surface of the outer housing 112.

The top of the outer housing 112 can be formed having an outer housing top thickness 116. The outer housing top thickness 116 can preferably be formed for guiding, registering, or referencing three-dimensional positions for the needles 104. The apertures 114 formed with the outer housing top thickness 116 can provide guidance, registration, or a reference for predetermined movement of the needles 104.

The outer housing 112 can also include an outer housing recess 118 formed in a top of the outer housing 112. The apertures 114 can be formed in the outer housing recess 118. Evacuation channels (not shown) can also be formed in the outer housing 112 to provide for evacuation of ambient gases such as air over the top of the outer housing 112. The apertures 114 that are not populated with the needles 104 can also provide an evacuation path and server as evacuation channels.

The outer housing 112 can also include outer features 120 such as registration or alignment recesses or protrusions that can align or correspond to base features 122 such as registration or alignment recesses or protrusions of the base housing 110. The base features 112 can protrude horizontally outward or away from sides of the base housing 110. For example, one of the base features 122 can be formed as a protrusion substantially the same shape and smaller than one of the outer features 120 formed as a recess wherein the base features 122 can fit into the outer features 120 during assembly for substantially fixed positioning of and preventing rotational movement between the outer housing 112 and the base housing 110.

Optionally, a pattern of the needles 104 or the outer housing 112 can be assembled having top horizontal planar dimensions predetermined to be smaller than planar dimensions of target devices. Another option provides multiple patterns for the needles 104 or the outer housing 112 for multiple device sizes. For this other option, the needles 104 can be assembled in one or more locations depending on device size or sizes.

It has been discovered that the semiconductor system 100 having the magnetic needle base 102 eliminates the need for a needle holder adjacent the magnet 106 as well as strengthens stability, flatness and alignment resulting in significantly improved needle set up or change as well as die pickup including eliminating die cracking. Further, the needles inserted in the outer housing 112 over the magnetic needle base 102 eliminate stress and unbalanced needle height providing significantly improved stability particularly with thin die.

Figure 2:
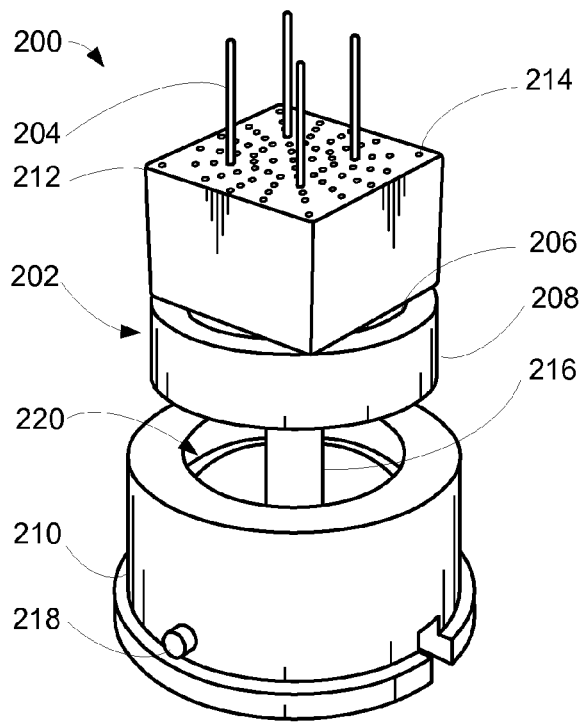
FIG. 2 is an isometric view of a semiconductor system for peeling semiconductor chips from tape in a needle assembly phase of a second embodiment of the present invention.

Referring now to FIG. 2 therein is shown an isometric view of a semiconductor system 200 for peeling semiconductor chips from tape in a needle assembly phase of a second embodiment of the present invention. The semiconductor system 200 from tape preferably includes a magnetic needle base 202 such as a permanent magnetic holder. Needles 204 can be assembled over the magnetic needle base 202 in an array predetermined by a planar dimension of a device (not shown) such as an integrated circuit.

The magnetic needle base 202 can include a magnet 206 such as a permanent magnet over a magnet housing 208. The magnet housing 208 with the magnet 206 can provide a substantially fixed and substantially planar horizontal position as well as vertical movement of the needles 204. The vertical movement of the needles 204 over the magnetic needle base 202 can provide lifting or stretching of an adhesive material (not shown) under the device resulting in peeling or removal of the adhesive material from the device.

The magnetic needle base 202 can be formed over a base housing 210 providing a substantially fixed base from which the magnetic needle base 202 can move vertically. The base housing 210 can provide guidance, registration, or a reference for the vertical movement of the magnetic needle base 202. The base housing 210 can be formed to provide substantially vertical movement of the magnetic needle base 202 minimizing horizontal movement.

A needle block 212 can be formed over the magnetic needle base 202. The needle block 212 preferably includes needle holes 214 providing guidance, registration, or a reference for placing the needles 204. The needles 204 can move vertically through the needle holes 214 formed substantially vertically providing a hole through the needle block 212 from a surface adjacent the magnetic needle base 202 to an opposite surface of the needle block 212. The needle block 212 provides a substantially fixed array for the needles 204.

The needle block 212 can be formed having a predetermined thickness. The thickness can preferably be predetermined for guiding, registering, or referencing three-dimensional positions for the needles 204. The needle holes 214 formed with the predetermined thickness of the needle block 212 can provide guidance, registration, or a reference for predetermined movement of the needles 204 without the need for a thick top housing such as the outer housing 112 of FIG. 1 having the outer housing top thickness 116 of FIG. 1.

The needle block 212 with the magnetic needle base 202 can move wherein the base housing 210 is substantially fixed. A needle base extension 216 such as a connector to actuate movement of the magnetic needle base 202 can provide connection to a motion source through a base opening 220 of the base housing 210. The base housing 210 can also include base features 218 such as registration or alignment recesses or protrusions of the base housing 210.

Figure 3:
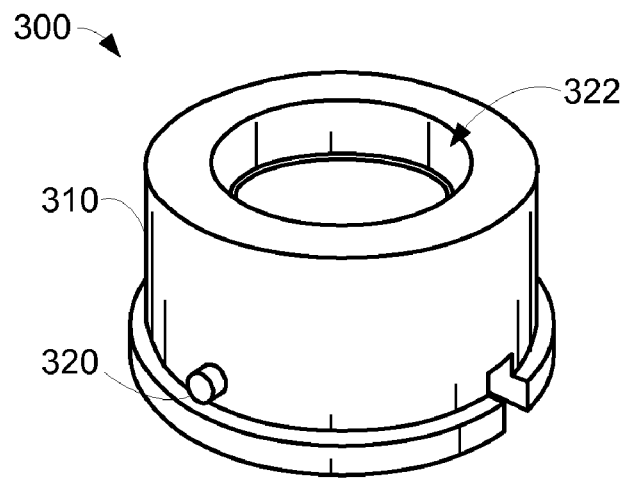
FIG. 3 is an isometric view of a semiconductor system for peeling semiconductor chips from tape in a base housing assembly phase of a third embodiment of the present invention.

Referring now to FIG. 3, therein is shown an isometric view of a semiconductor system 300 for peeling semiconductor chips from tape in a base housing assembly phase of a third embodiment of the present invention. Similar to the semiconductor system 100, the semiconductor system 300 preferably includes a base housing 310. The base housing 310 can provide a substantially fixed base from which components of the semiconductor system 300 can move vertically.

The base housing 310 can provide guidance, registration, or a reference for vertical movement of the components. The base housing 310 can be formed to provide substantially vertical movement and minimizing horizontal movement. The base housing 310 can also include base features 320 such as registration or alignment recesses or protrusions of the base housing 310 and a base opening 322.

Figure 4:
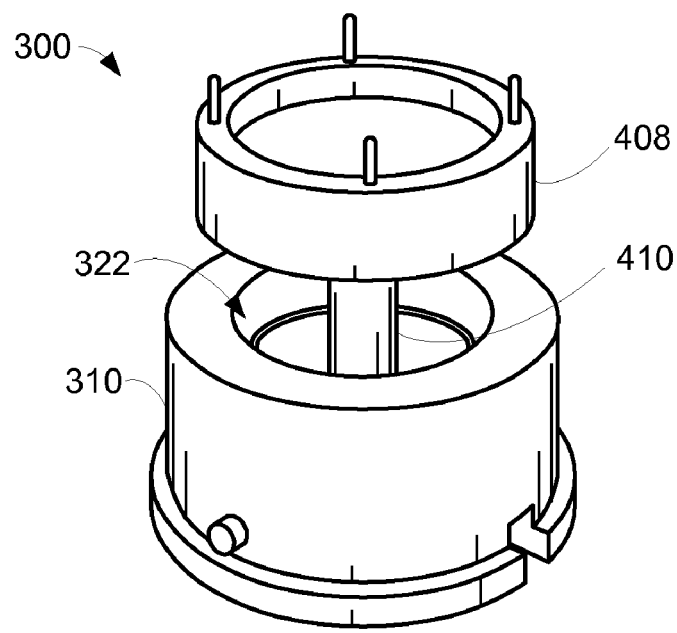
FIG. 4 is an isometric view of the structure of FIG. 3 in a magnet housing assembly phase.

Referring now to FIG. 4, therein is shown an isometric view of the structure of FIG. 3 in a magnet housing assembly phase. The semiconductor system 300 preferably includes a magnet housing 408. The magnet housing 408 can provide a substantially fixed and substantially planar horizontal position as well as vertical movement over the base housing 310. The vertical movement of the magnet housing 408 can provide lifting or stretching of an adhesive material (not shown) resulting in peeling or removal of the adhesive material.

The magnet housing 408 can also include a needle base extension 410 such as a connector to actuate movement of the magnet housing 408. The needle base extension 410 can provide connection to a motion source through the base opening 322 of the base housing 310. The magnet housing 408 having the needle base extension 410 can move substantially vertically through the base housing 310 wherein the base housing 310 is substantially fixed.

Figure 5:
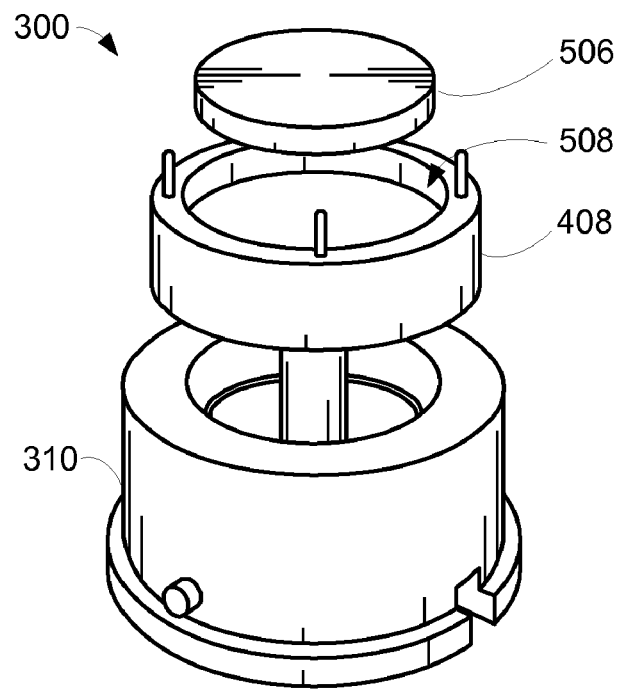
FIG. 5 is an isometric view of the structure of FIG. 4 in a magnet mount phase.

Referring now to FIG. 5, therein is shown an isometric view of the structure of FIG. 4 in a magnet mount phase. The semiconductor system 300 preferably includes a magnet 506 such as a permanent magnet over the magnet housing 408. The magnet housing 408 can include a magnet recess 510 having predetermined dimension slightly larger than dimensions of the magnet 506. The magnet housing 408 with the magnet 506 at least partially in the magnet recess 510 can provide a substantially fixed and substantially planar horizontal position as well as vertical movement.

Figure 6:
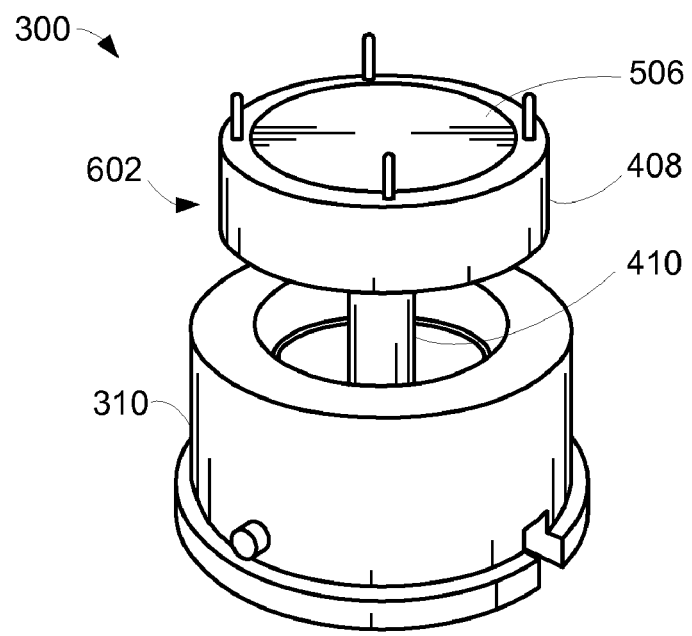
FIG. 6 is an isometric view of the structure of FIG. 5 in a needle base assembly phase.

Referring now to FIG. 6, therein is shown an isometric view of the structure of FIG. 5 in a needle base assembly phase. The semiconductor system 300 preferably includes a magnetic needle base 602 including the magnet 506 over the magnet housing 408 and the needle base extension 410. The magnet housing 408 with the magnet 506 can provide a substantially fixed and substantially planar horizontal position as well as vertical movement.

The magnetic needle base 602 can be formed over the base housing 310 providing a substantially fixed base from which the magnetic needle base 602 can move vertically. The base housing 310 can provide guidance, registration, or a reference for the vertical movement of the magnetic needle base 602. The base housing 310 can be formed to provide substantially vertical movement of the magnetic needle base 602 minimizing horizontal movement.

Figure 7:
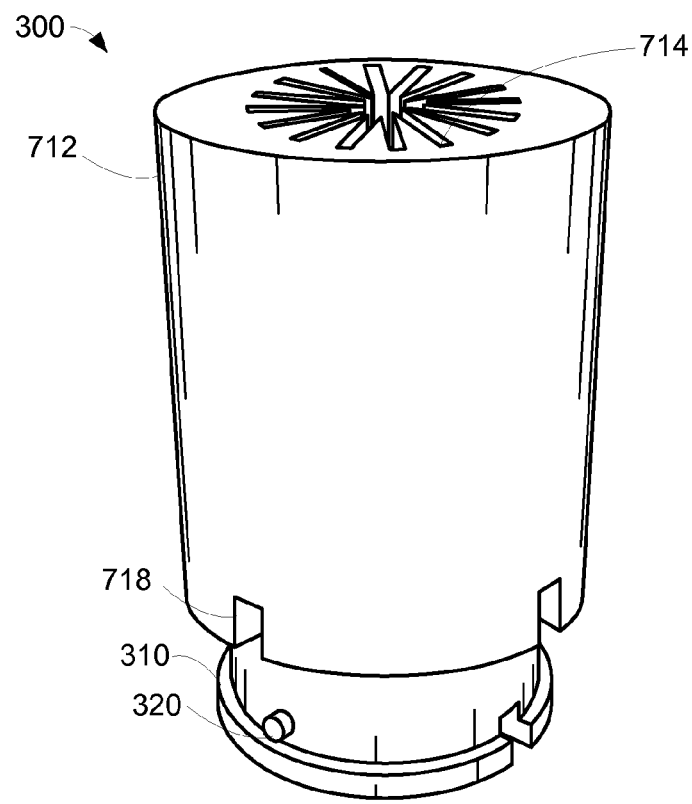
FIG. 7 is an isometric view of the structure of FIG. 6 in a housing mount phase.

Referring now to FIG. 7, therein is shown an isometric view of the structure of FIG. 6 in a housing mount phase. The semiconductor system 300 preferably includes an outer housing 712 formed over the base housing 310 and the magnetic needle base 602 of FIG. 6. The outer housing 712 preferably includes apertures 714 providing guidance, registration, or a reference for movement particularly substantially vertical movement.

The outer housing 712 can also include outer features 718 such as registration or alignment recesses or protrusions that can align or correspond to the base features 320 such as registration or alignment recesses or protrusions of the base housing 310. For example, one of the base features 320 can be formed as a protrusion substantially the same shape and smaller than one of the outer features 718 formed as a recess wherein the base features 320 can fit into the outer features 718 during assembly for substantially fixed positioning of the outer housing 712 and the base housing 310.

Figure 8:
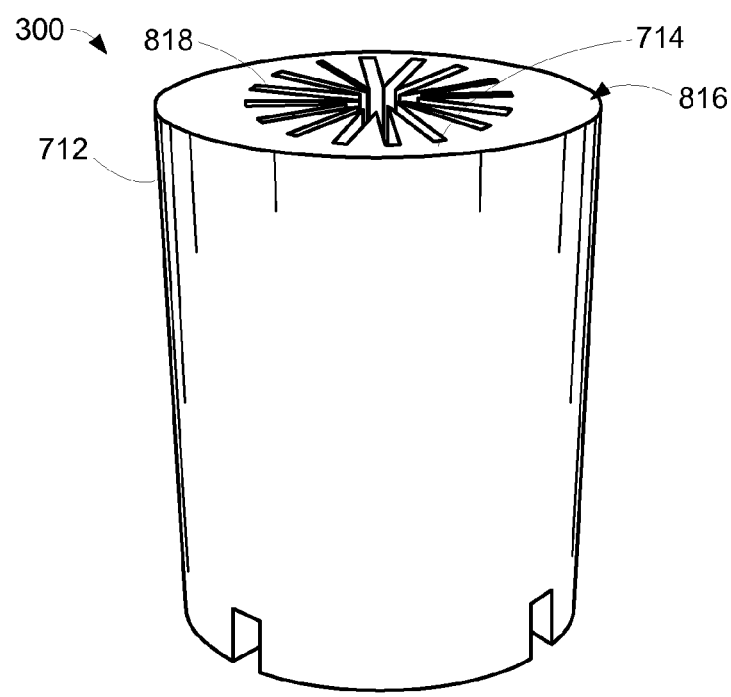
FIG. 8 is an isometric view of the structure of FIG. 7 in a housing assembly phase.

Referring now to FIG. 8, therein is shown an isometric view of the structure of FIG. 7 in a housing assembly phase. The semiconductor system 300 preferably includes the outer housing 712 with the apertures 714. The apertures 714 can be formed substantially vertically providing an opening through an outer housing top 816 from an interior to an external surface of the outer housing top 816.

The outer housing top 816 can also include an outer housing recess 818. The apertures 714 can also be formed in the outer housing recess 818. The apertures 714 can be formed in the outer housing recess 818. Evacuation channels (not shown) can also be formed in the outer housing 712 to provide for evacuation of ambient gases such as air over the outer housing top 816. The apertures 714 that are not populated can also provide an evacuation path and server as evacuation channels.

The outer housing 712 can also include the outer housing recess 818 formed in a top of the outer housing 712. The apertures 714 can be formed in the outer housing recess 818. Evacuation channels (not shown) can also be formed in the outer housing 712 to provide for evacuation of ambient gases such as air over the top of the outer housing 712. The apertures 714 that are not populated can also provide an evacuation path and server as evacuation channels.

Figure 9:
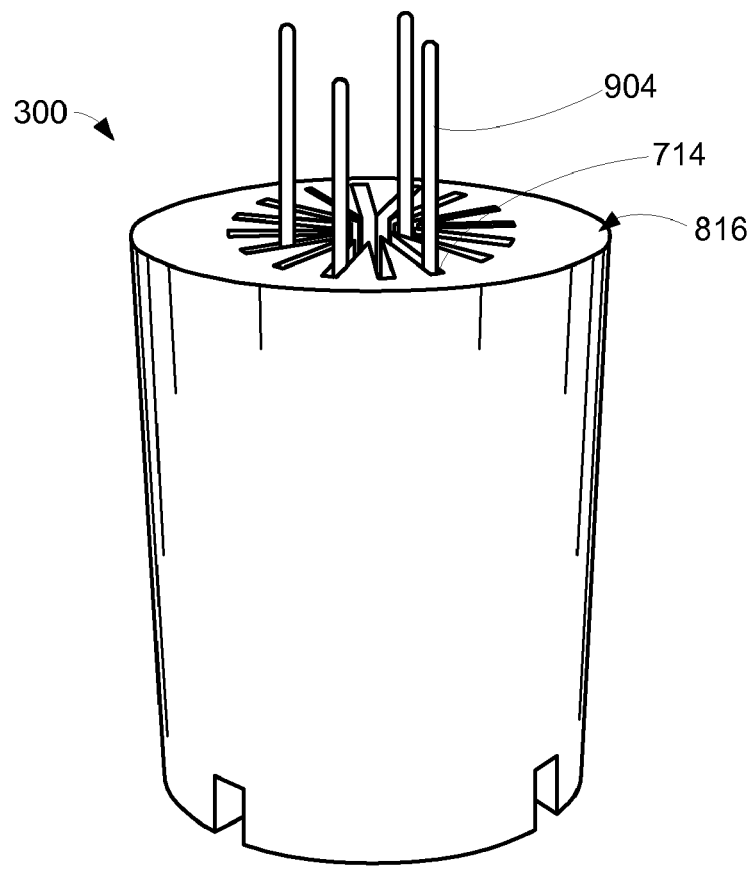
FIG. 9 is an isometric view of the structure of FIG. 8 in a needle assembly phase.

Referring now to FIG. 9, therein is shown an isometric view of the structure of FIG. 8 in a needle assembly phase. The semiconductor system 300 preferably includes needles 904 assembled over the magnetic needle base 602 of FIG. 6 in an array predetermined by a planar dimension of a device (not shown) such as an integrated circuit.

The magnetic needle base 602 including the magnet housing 408 of FIG. 4 and the magnet 506 of FIG. 5 can provide a substantially fixed and substantially planar horizontal position. The vertical movement of the needles 904 over the magnetic needle base 602 can provide lifting or stretching of an adhesive material (not shown) under the device resulting in peeling or removal of the adhesive material from the device.

The apertures 714 provide guidance, registration, or a reference for movement of the needles 904. The needles 904 can move vertically through the apertures 714 formed substantially vertically providing a channel through the outer housing top 816 from an interior to an external surface of the outer housing top 816.

Figure 10:
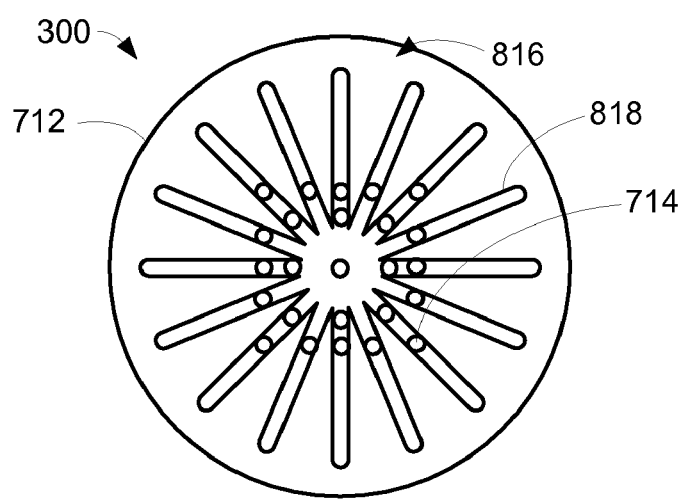
FIG. 10 is a top plan view of the structure of FIG. 9.

Referring now to FIG. 10, therein is shown a top plan view of the structure of FIG. 9. The semiconductor system 300 preferably includes the outer housing 712 having the apertures 714 formed in the outer housing recess 818 of the outer housing top 816. Any number or arrangement of the apertures 714 can be formed to provide guidance, registration, or a reference for movement of the needles 904 particularly in a substantially vertical direction.

The number or arrangement of the apertures 714 can also provide compatibility with planar dimensions of multiple target device sizes. Patterns of the apertures 714 can provide top horizontal planar dimensions predetermined to be smaller than planar dimensions of target devices. Alternatively, patterns for the apertures 714 can be assembled in one or more locations depending on device size or sizes.

Figure 11:
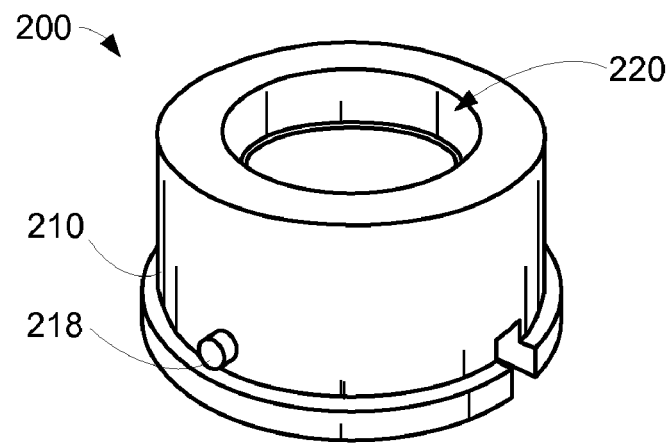
FIG. 11 is an isometric view of the semiconductor system in a base housing assembly phase.

Referring now to FIG. 11, therein is shown an isometric view of the semiconductor system 200 in a base housing assembly phase. The semiconductor system 200 preferably includes the base housing 210 having the base opening 220 and providing a substantially fixed base from which components can move vertically.

The base housing 210 can provide guidance, registration, or a reference for vertical movement of the components. The base housing 210 can be formed to provide substantially vertical movement minimizing horizontal movement. The base housing 210 can also include the base features 218 such as registration or alignment recesses or protrusions of the base housing 210.

Figure 12:
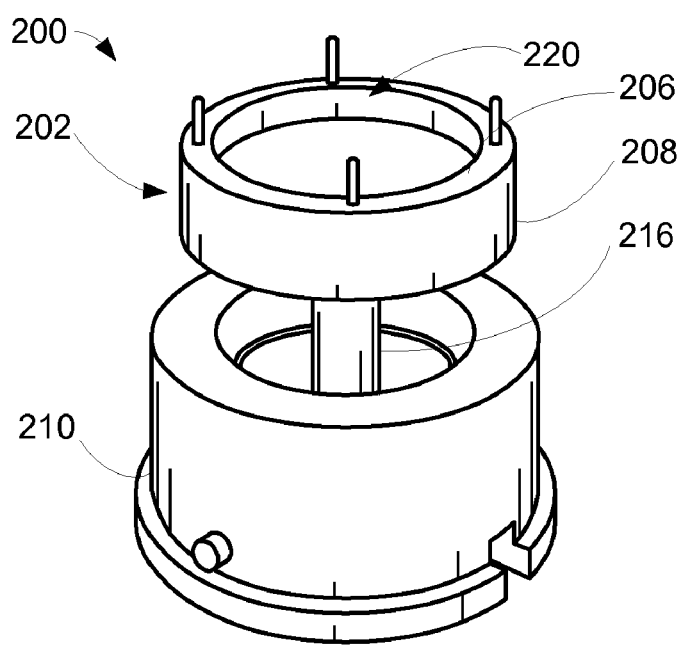
FIG. 12 is an isometric view of the structure of FIG. 11 in a magnet housing assembly phase.

Referring now to FIG. 12, therein is shown an isometric view of the structure of FIG. 11 in a magnet housing assembly phase. The semiconductor system 200 preferably includes the magnet housing 208. The magnet housing 208 can provide a substantially fixed and substantially planar horizontal position as well as vertical movement.

The magnetic needle base 202 can also include the needle base extension 216 such as a connector to actuate movement of the magnetic needle base 202. The needle base extension 216 can provide connection to a motion source through the base opening 220 of the base housing 210. The magnetic needle base 202 having the needle base extension 216 can move substantially vertically through the base housing 210 wherein the base housing 210 is substantially fixed.

Figure 13:
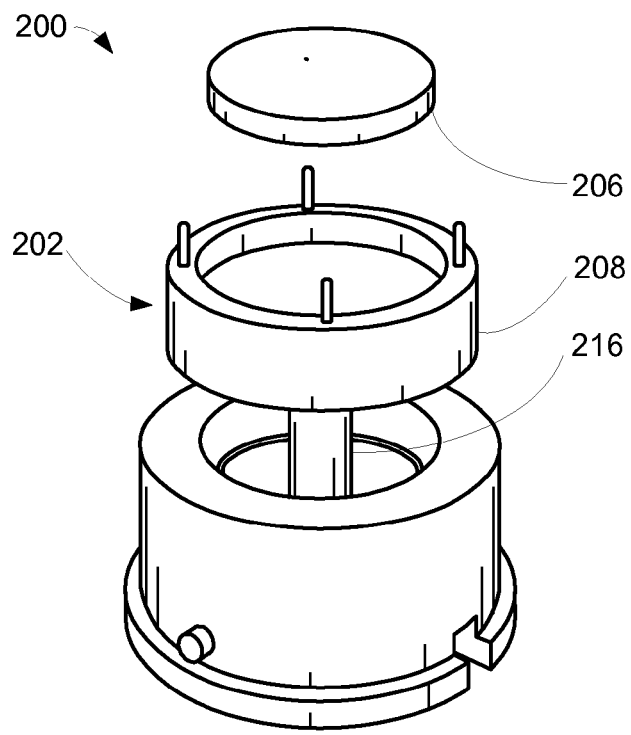
FIG. 13 is an isometric view of the structure of FIG. 12 in a magnet mount phase.

Referring now to FIG. 13, therein is shown an isometric view of the structure of FIG. 12 in a magnet mount phase. The semiconductor system 200 preferably includes the magnetic needle base 202 can include the magnet 206 such as a permanent magnet over the magnet housing 208. The magnet housing 208 with the magnet 206 can provide a substantially fixed and substantially planar horizontal position as well as vertical movement.

Figure 14:
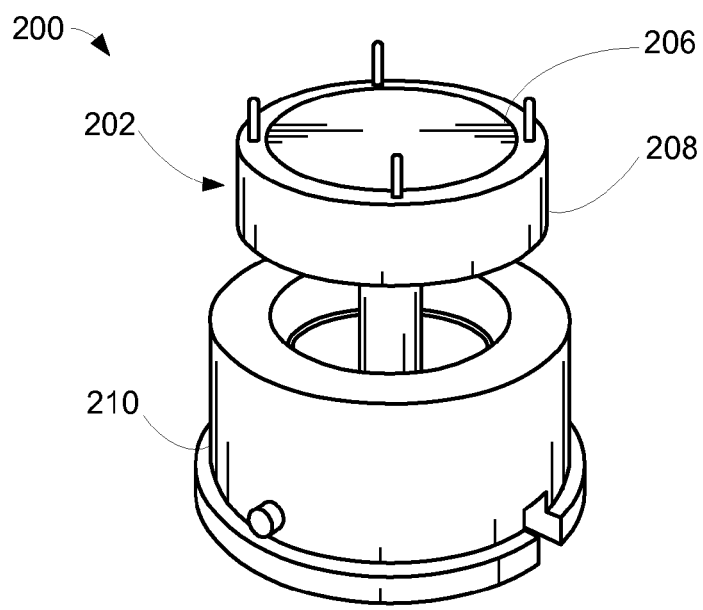
FIG. 14 is an isometric view of the structure of FIG. 13 in a base assembly phase.

Referring now to FIG. 14, therein is shown an isometric view of the structure of FIG. 13 in a base assembly phase. The semiconductor system 200 preferably includes the magnetic needle base 202 including the magnet 206 over the magnet housing 208. The magnet housing 208 with the magnet 206 can provide a substantially fixed and substantially planar horizontal position as well as vertical movement.

The magnetic needle base 202 can be formed over the base housing 210 providing a substantially fixed base from which the magnetic needle base 202 can move vertically. The base housing 210 can provide guidance, registration, or a reference for the vertical movement of the magnetic needle base 202. The base housing 210 can be formed to provide substantially vertical movement of the magnetic needle base 202 minimizing horizontal movement.

Figure 15:
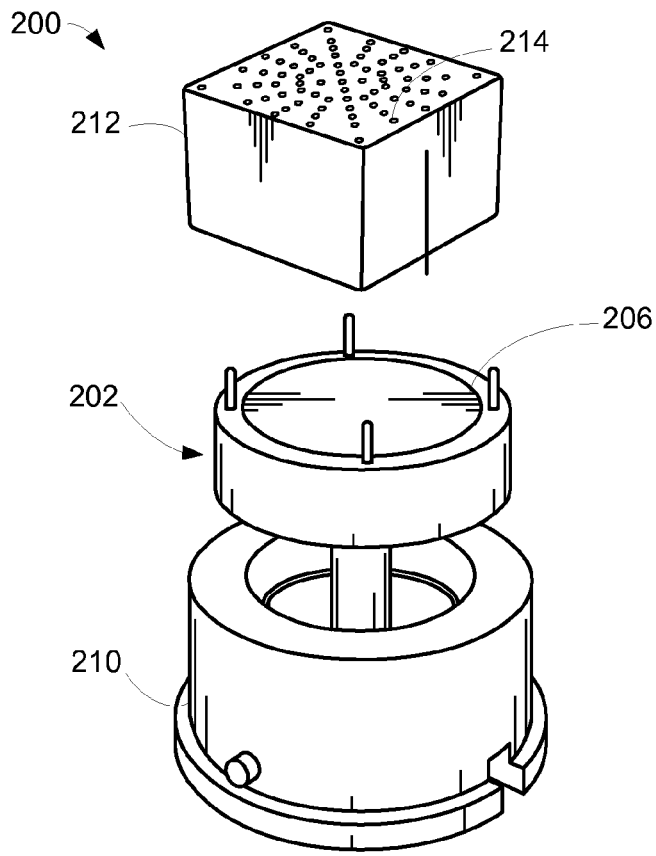
FIG. 15 is an isometric view of the structure of FIG. 14 in a block assembly phase.

Referring now to FIG. 15, therein is shown an isometric view of the structure of FIG. 14 in a block assembly phase. The semiconductor system 200 preferably includes the needle block 212 assembled over the magnet 206 of the magnetic needle base 202 and the base housing 210. The needle block 212 preferably includes the needle holes 214 providing guidance, registration, or a reference.

Figure 16:
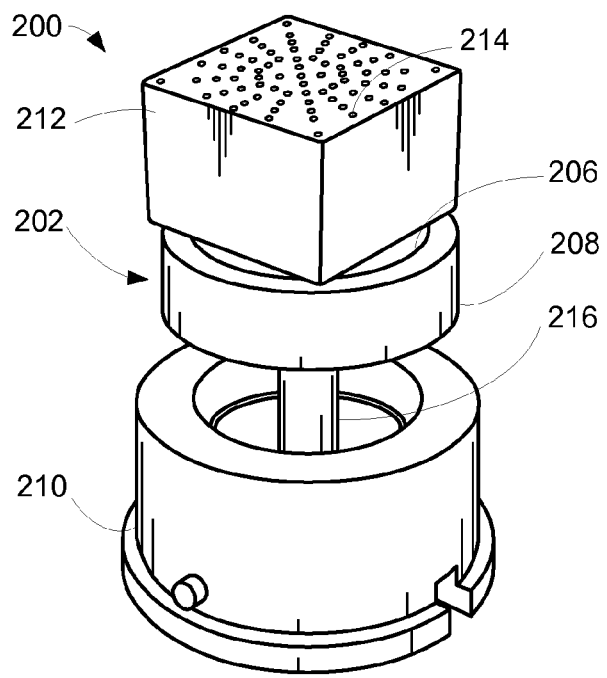
FIG. 16 is an isometric view of the structure of FIG. 15 in a block mount phase.

Referring now to FIG. 16, therein is shown an isometric view of the structure of FIG. 15 in a block mount phase. The semiconductor system 200 preferably includes the needle holes 214 formed substantially vertically providing a hole through the needle block 212 from a surface adjacent the magnet 206 of the magnetic needle base 202 to an opposite surface of the needle block 212.

The needle block 212 provides a substantially fixed array for the needle holes 214 over the magnet 206. The needle block 212, the magnet 206, the magnet housing 208, and the needle base extension 216 can move in a substantially vertical direction wherein the base housing 210 can be substantially fixed.

Figure 17:
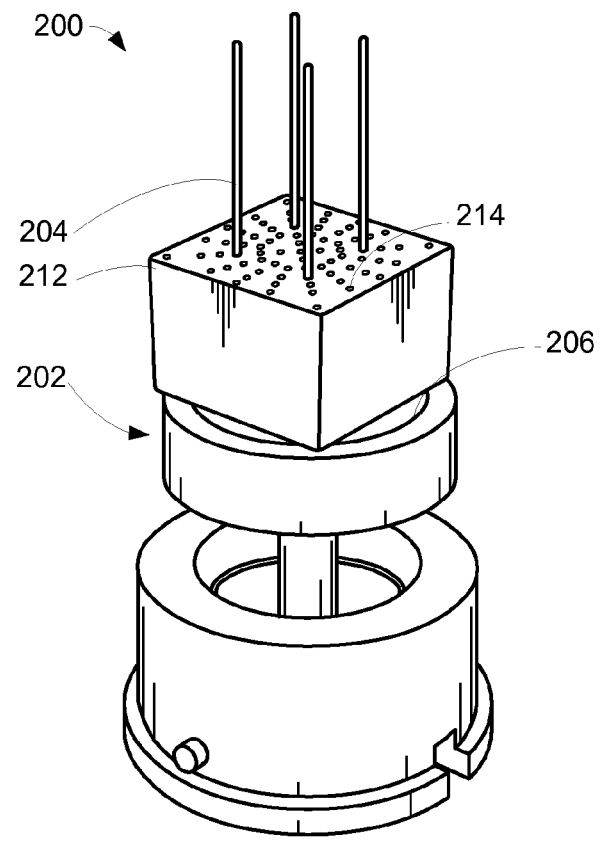
FIG. 17 is an isometric view of the structure of FIG. 16 in a needle insertion phase.

Referring now to FIG. 17, therein is shown an isometric view of the structure of FIG. 16 in a needle insertion phase. The semiconductor system 200 preferably includes the needles 204 assembled over the magnet 206 of the magnetic needle base 202 in an array predetermined by a planar dimension of a device (not shown) such as an integrated circuit.

Figure 18:
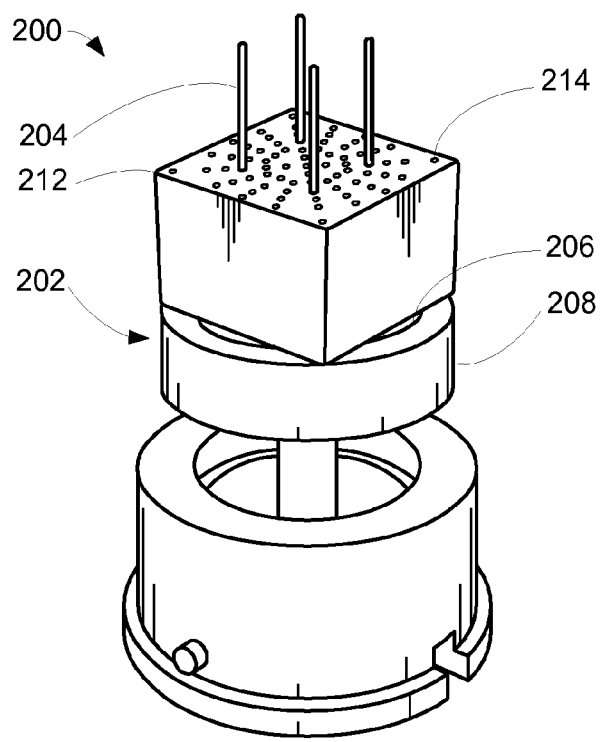
FIG. 18 is an isometric view of the structure of FIG. 17 in a needle assembly phase.

Referring now to FIG. 18, therein is shown an isometric view of the structure of FIG. 17 in a needle assembly phase. The semiconductor system 200 preferably includes the magnet housing 208 with the magnet 206 providing a substantially fixed and substantially planar horizontal position for the needles 204 at least partially in the needle block 212. The vertical movement of the needles 204 with the magnetic needle base 202 can provide lifting or stretching of an adhesive material (not shown) under the device resulting in peeling or removal of the adhesive material from the device.

Figure 19:
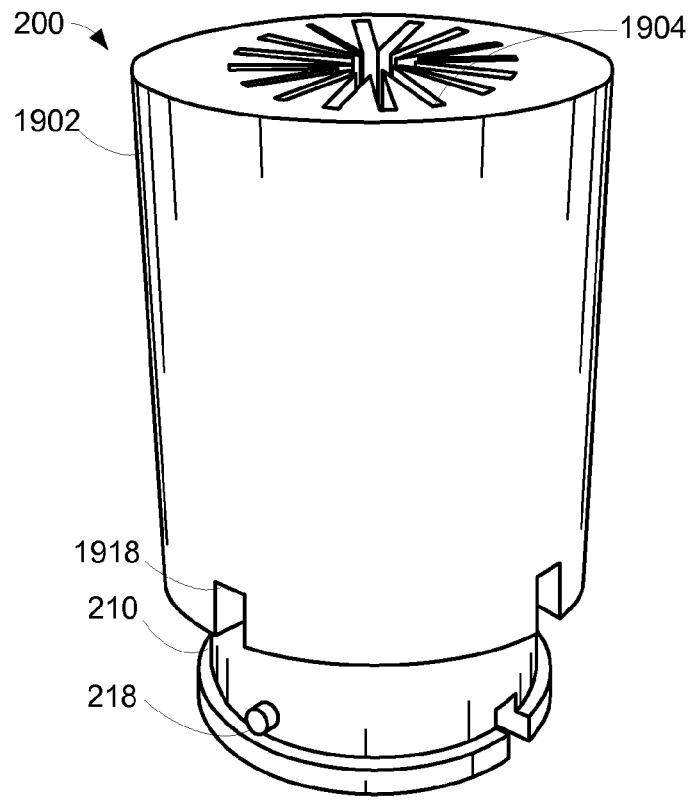
FIG. 19 is an isometric view of the structure of FIG. 18 in a housing mount phase.

Referring now to FIG. 19, therein is shown an isometric view of the structure of FIG. 18 in a housing mount phase. The semiconductor system 200 preferably includes an outer housing 1902 formed over the magnetic needle base 202 of FIG. 2. The outer housing 1902 preferably includes apertures 1904 providing guidance, registration, or a reference for movement particularly substantially vertical movement.

The outer housing 1902 can also include outer features 1918 such as registration or alignment recesses or protrusions that can align or correspond to the base features 218 such as registration or alignment recesses or protrusions of the base housing 210. For example, one of the base features 218 can be formed as a protrusion substantially the same shape and smaller than one of the outer features 1918 formed as a recess wherein the base features 218 can fit into the outer features 1918 during assembly for substantially fixed positioning of the outer housing 1902 and the base housing 210.

Figure 20:
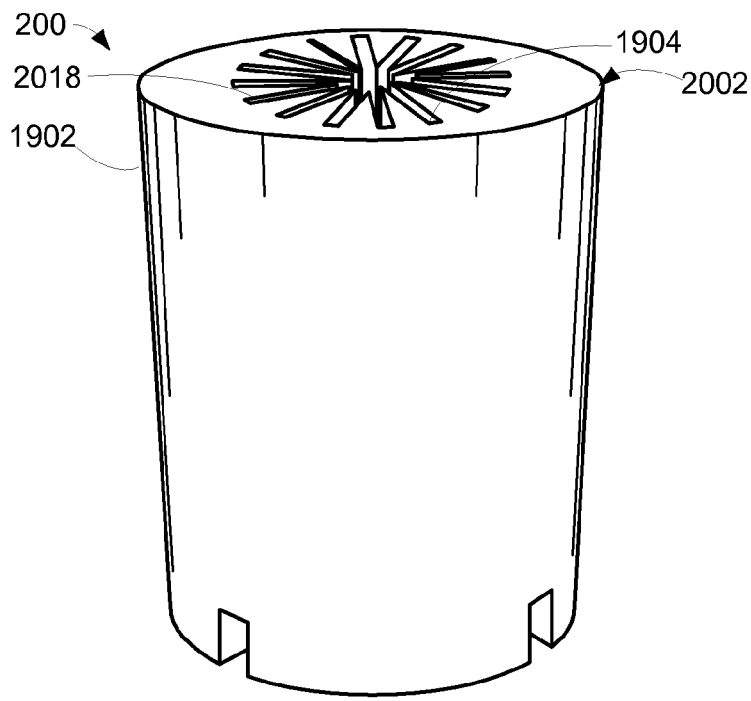
FIG. 20 is an isometric view of the structure of FIG. 19 in a housing assembly phase.

Referring now to FIG. 20, therein is shown an isometric view of the structure of FIG. 19 in a housing assembly phase. The semiconductor system 200 preferably includes the outer housing 1902 with the apertures 1904. The apertures 1904 can be formed substantially vertically providing an opening through an outer housing top 2002 from an interior to an external surface of the outer housing top 2002.

The outer housing top 2002 can also include an outer housing recess 2018. The apertures 1904 can also be formed in the outer housing recess 2018. The apertures 1904 can be formed in the outer housing recess 2018. Evacuation channels (not shown) can also be formed in the outer housing 1902 to provide for evacuation of ambient gases such as air over the outer housing top 2002. The apertures 1904 that are not populated with the needles 204 can also provide an evacuation path and server as evacuation channels.

The outer housing 1902 can also include the outer housing recess 2018 formed in a top of the outer housing 1902. The apertures 1904 can be formed in the outer housing recess 2018. Evacuation channels (not shown) can also be formed in the outer housing 1902 to provide for evacuation of ambient gases such as air over the top of the outer housing 1902. The apertures 1904 that are not populated can also provide an evacuation path and server as evacuation channels.

Figure 21:
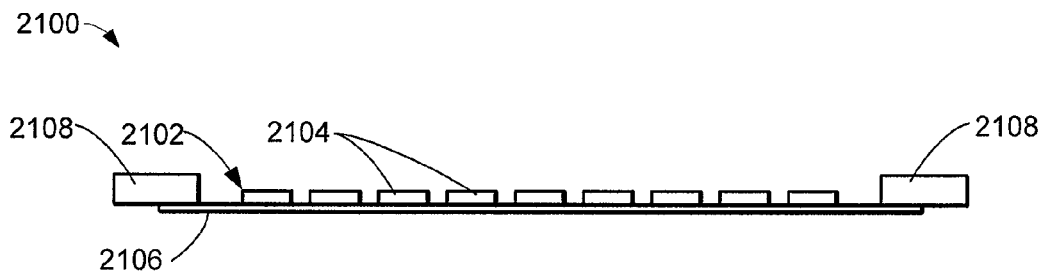
FIG. 21 is a figurative, cross-sectional view, taken on line 21-21 in FIG. 22.
Figure 22:
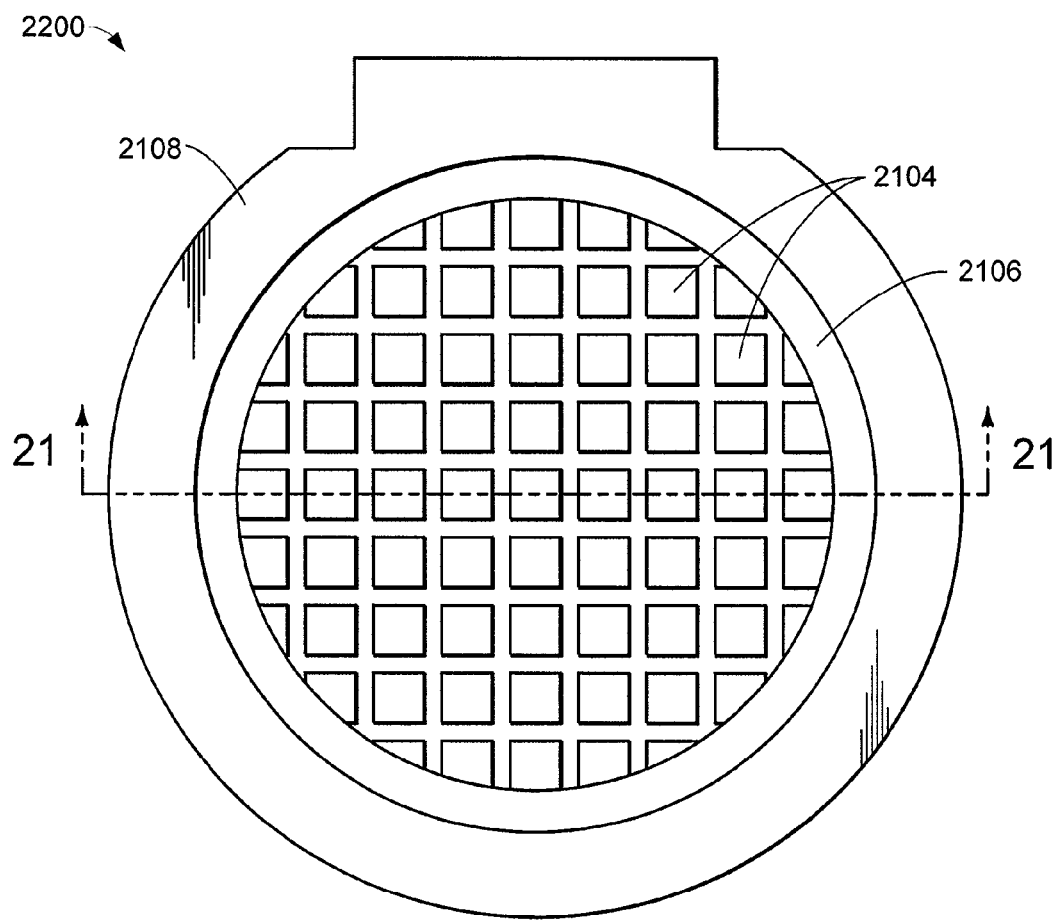
FIG. 22 is a top plan view of the structure of FIG. 21.

Referring now to FIG. 21, therein is shown a figurative, cross-sectional view 2100, taken on line 21-21 in FIG. 22. The figurative, cross-sectional view 2100 includes a wafer 2102 that has been singulated into chips 2104 after attachment to an adhesive material 2106 such as an adhesive tape. The wafer 2102 can be attached to the adhesive material 2106 can be within a frame or carrier 2108. Each of the chips 2104 can be singulated from one another to form individual, electrically isolated devices.

Referring now to FIG. 22, therein is shown a top plan view 2200 of the structure of FIG. 21. The top plan view 2200 includes the carrier 2108 over the adhesive material 2106 wherein the chips 2104 can be attached to the adhesive material 2106. The chips 2104 attached to the adhesive material 2106 can be singulated. The carrier 2108 can provide structural integrity to the adhesive material 2106 with the chips 2104 during processing.

Figure 23:
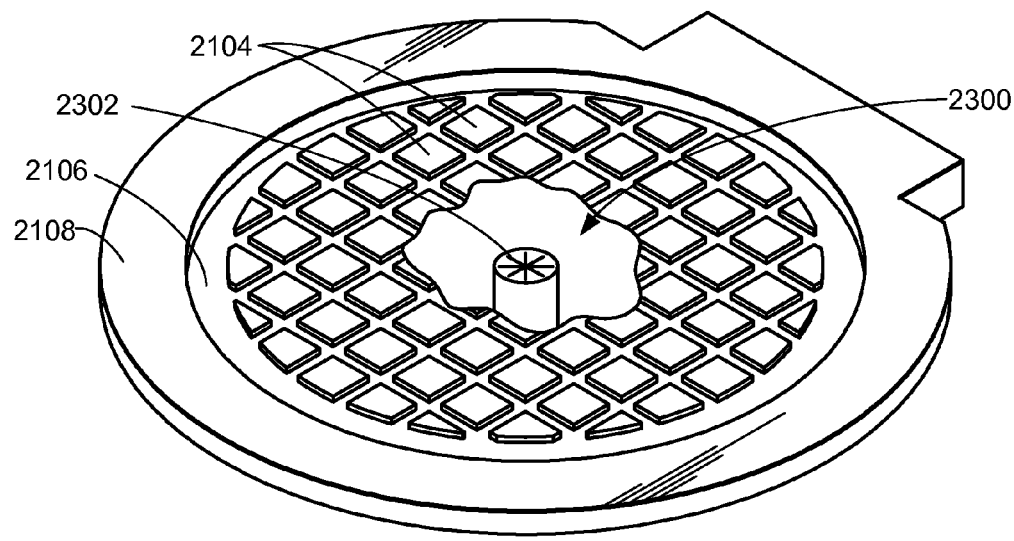
FIG. 23 is a partially broken-away isometric view of the structure of FIG. 22 beneath which a semiconductor system in a fourth embodiment of the present invention has been positioned.

Referring now to FIG. 23, therein is shown a partially broken-away isometric view of the structure of FIG. 22 beneath which a semiconductor system 2300 in a fourth embodiment of the present invention has been positioned. The semiconductor system 2300 has an outer housing top 2302 sometimes referred to as a nose that has been centered beneath a particular target chip 2104' (not shown in FIG. 23, but see FIGS. 24 and 25) for separation of the target chip 2104' from the adhesive material 2106.

Figure 24:
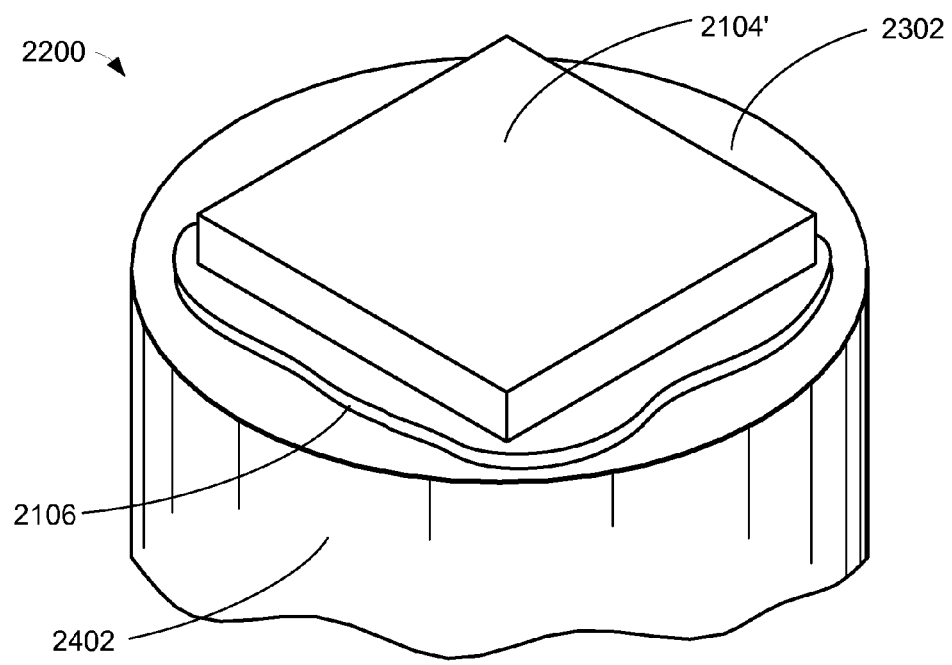
FIG. 24 is an enlarged view of the center portion of FIG. 23 that illustrates the semiconductor system.

Referring now to FIG. 24, therein is shown an enlarged view of the center portion of FIG. 23 that illustrates the semiconductor system 2300. The outer housing top 2302 of an outer housing 2402 can extend or be raised by a modest height and is in contact with the adhesive material 2106. In operation, the outer housing top 2302 will be centered beneath a chip, such as the target chip 104', that is to be separated from the adhesive material 2106.

Figure 25:
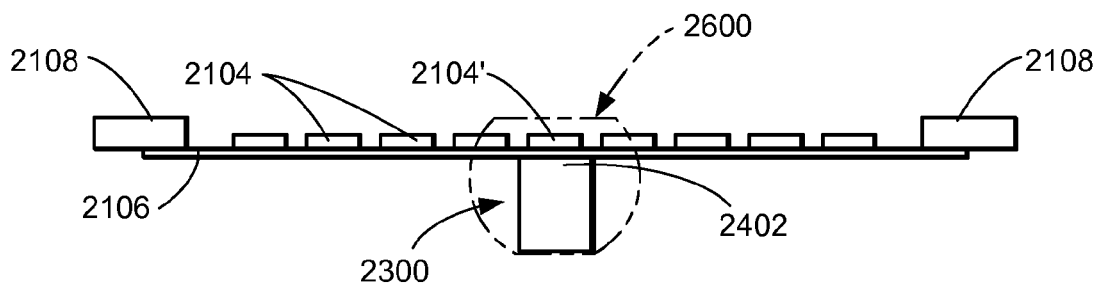
FIG. 25 is a view similar to FIG. 21 with the semiconductor system operationally positioned beneath the target chip.

Referring now to FIG. 25, therein is shown a view similar to FIG. 21 with the semiconductor system 2300 operationally positioned beneath the target chip 2104'. The chips 2104 are shown after attachment to the adhesive material 2106 within the frame or the carrier 2108. The outer housing 2402 of the semiconductor system 2300 is shown positioned adjacent the adhesive material 2106 beneath the target chip 2104'. A portion of FIG. 25 is identified within an outline 2600, which is described in greater detail below.

Figure 26:
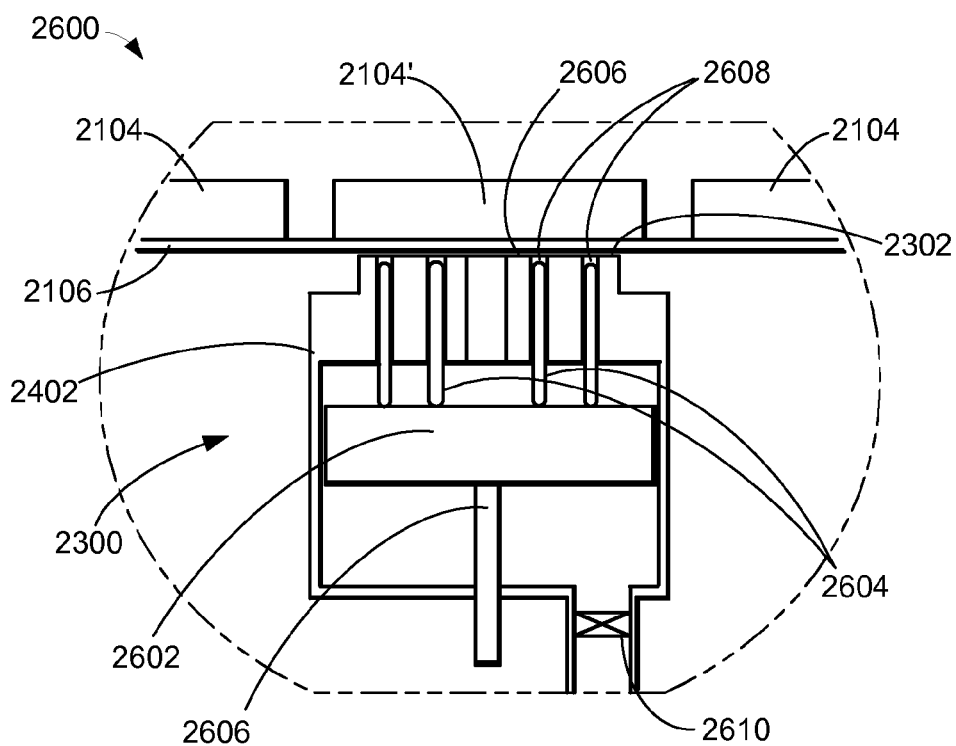
FIG. 26 is an enlarged sectional view of the portion of FIG. 25 within the outline therein.

Referring now to FIG. 26, therein is shown an enlarged sectional view of the portion of FIG. 25 within the outline 2600 therein. In FIG. 26, some elements of the semiconductor system 2300 within the outline 2600 have been omitted for clarity of illustration.

As shown in FIG. 26, the outer housing 2402 of the semiconductor system 2300 has been centered beneath the target chip 2104'. The outer housing top 2302 is adjacent and about to contact the adhesive material 2106 on a bottom side of the adhesive material 2106 opposite the target chip 2104'. The outer housing top 2302 is smaller than the target chip 2104'.

Within the outer housing 2402 is a magnet 2602. The magnet 2602 supports needles 2604 that are beneath and aligned with apertures 2608 in the outer housing 2402. In turn, the magnet 2602 is connected to and supported by a needle base extension 2606 that is configured in known fashion for controlled upward and downward movement. The controlled upward and downward movement of the needle base extension 2606 extends the needles 2604 correspondingly upwardly partly through the apertures 2608 and then retracts the needles 2604 back downwardly through the apertures 2608 into the interior of the outer housing 2402.

A portion of the interior of the outer housing 2402 of the semiconductor system 2300 is hollow. To evacuate this portion of the interior of the semiconductor system 2300, a vacuum source (not shown) is connected to the interior of the outer housing 2402 through a valve 2610. In one embodiment, the valve 2610 is an integral part of the vacuum source. The valve 2610 can be actuated to evacuate the hollow interior of the outer housing 2402 and to apply vacuum to the apertures 2608.

Figure 27:
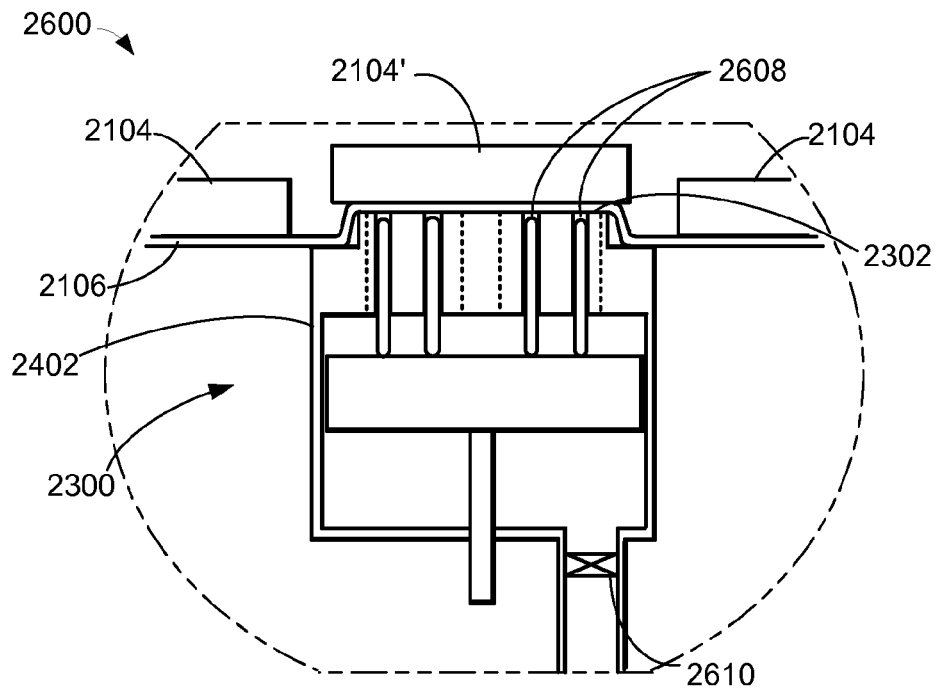
FIG. 27 is a view similar to FIG. 26, illustrating another phase in the operation of the semiconductor system.

Referring now to FIG. 27, therein is shown a view similar to FIG. 26, illustrating another phase in the operation of the semiconductor system 2300. The valve 2610 can be opened to connect the vacuum source (not shown) to the interior of the outer housing 2402. The attraction of the vacuum has drawn the adhesive material 2106 down against the top surface of the outer housing top 2302 and thereby holding the adhesive material 2106 by means of the apertures 2608. The vacuum also draws the adhesive material 2106 in like manner firmly down onto the top surface of the outer housing top 2302, by virtue of the apertures 2608.

As shown in FIG. 27, the semiconductor system 2300 has also been raised to elevate the target chip 2104'. By virtue of the attraction of the vacuum on the adhesive material 2106, portions of the adhesive material 2106 laterally beyond the outer housing top 2302, around peripheral edges of the target chip 2104', have been peeled away from the peripheral edges of the target chip 2104'. The adhesive material 2106 is thus held away from the peripheral edges over a normal contacting surface of the outer housing 2402. At the same time, the outer housing top 2302 supports the adhesive material 2106 in the center of the target chip 2104', effectively resisting and preventing peeling of the adhesive material 2106 from the center of the target chip 2104' at this time.

Figure 28:
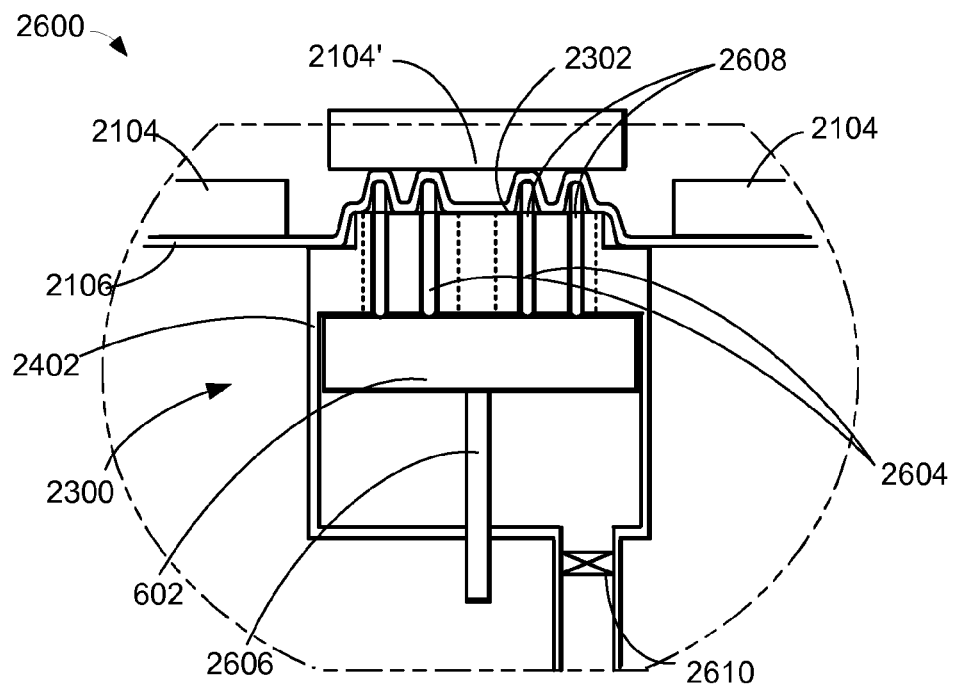
FIG. 28 is a view similar to FIG. 27, illustrating the final steps in separating the target chip from the adhesive material, just prior to lifting the target chip away therefrom.

Referring now to FIG. 28, therein is shown a view similar to FIG. 27, illustrating the final steps in separating the target chip 2104' from the adhesive material 2106, just prior to lifting the target chip 2104' away therefrom. The needles 2604 have been actuated and raised by the needle base extension 2606 and extend partly through the apertures 2608 to lift the target chip 2104' away from a top surface of the outer housing top 2302. The valve 2610 is maintained in an open condition so that vacuum continues to be applied beneath the adhesive material 2106. This causes the portions of the adhesive material 2106 not contacted or supported by the needles 2604 to continue to be held against the outer housing top 2302 and thus to separate from the target chip 2104'. The target chip 2104' is thus almost completely peeled from the adhesive material 2106 and can then be readily and easily removed in known fashion for subsequent bonding to any preferred target object, such as a printed circuit board, a leadframe, other substrate, and so forth.

Following removal of the target chip 2104', the needle base extension 2606 is returned downwardly, the valve 2610 is closed to release the vacuum, and the outer housing top 2302 and the semiconductor system 2300 are retracted downwardly away from the adhesive material 2106. The semiconductor system 2300 is then ready to successfully separate another of the chips 2104 from the adhesive material 2106 and is accordingly centered beneath another of the chips 2104, in the same manner as shown in FIG. 25. The process is then repeated.

Figure 29:
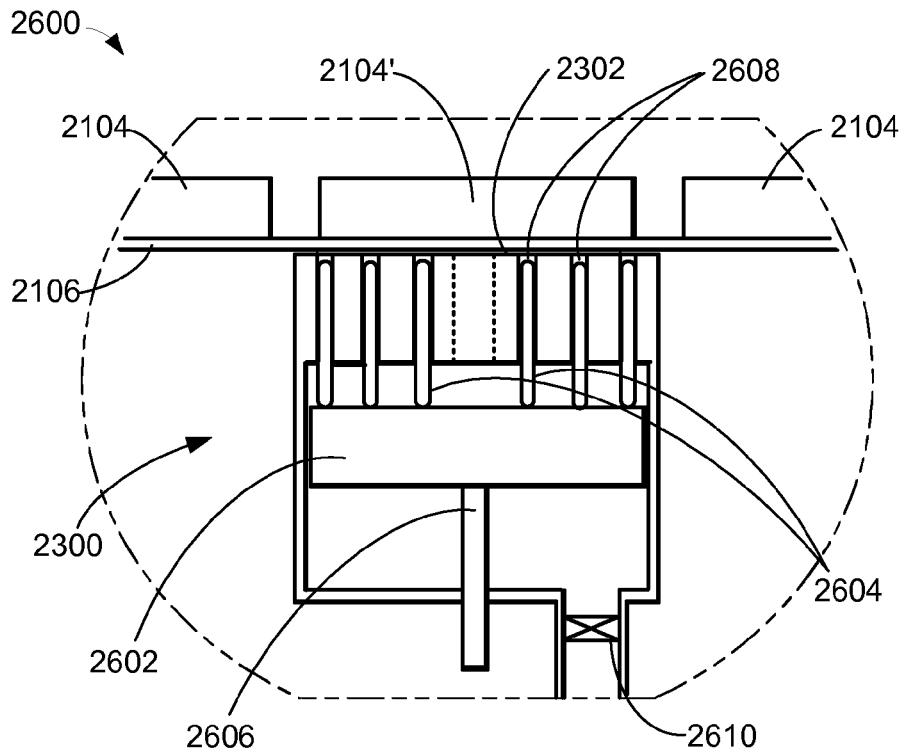
FIG. 29 is an enlarged sectional view of the portion of FIG. 25 within the outline therein in a fifth embodiment of the present invention.

Referring now to FIG. 29, therein is shown an enlarged sectional view of the portion of FIG. 25 within the outline 2600 therein in a fifth embodiment of the present invention. In FIG. 29, some elements of the semiconductor system 2300 within the outline 2600 have been omitted for clarity of illustration.

As shown in FIG. 29, the outer housing top 2302 of the semiconductor system 2300 has been centered beneath the target chip 2104'. The top surface of the outer housing top 2302 is adjacent and about to contact the adhesive material 2106 on the bottom side of the tape opposite the target chip 2104'. The outer housing top 2302 is larger than the target chip 2104'.

Within the outer housing top 2302 is the magnet 2602. The magnet 2602 supports the needles 2604 that are beneath and aligned with the apertures 2608 in the outer housing 2402. In turn, the magnet 2602 is connected to and supported by the needle base extension 2606 that is configured in known fashion for controlled upward and downward movement. The controlled upward and downward movement of the needle base extension 2606 extends the needles 2604 correspondingly upwardly partly through the apertures 2608 and then retracts the needles 2604 back downwardly through the apertures 2608 into the interior of the outer housing 2402.

A portion of the interior of the outer housing 2402 of the semiconductor system 2300 is hollow. To evacuate this portion of the interior of the semiconductor system 2300, a vacuum source (not shown) is connected to the interior of the outer housing 2402 through the valve 2610. In one embodiment, the valve 2610 is an integral part of the vacuum source. The valve 2610 can be actuated to evacuate the hollow interior of the outer housing 2402 and to apply vacuum to the apertures 2608.

Figure 30:
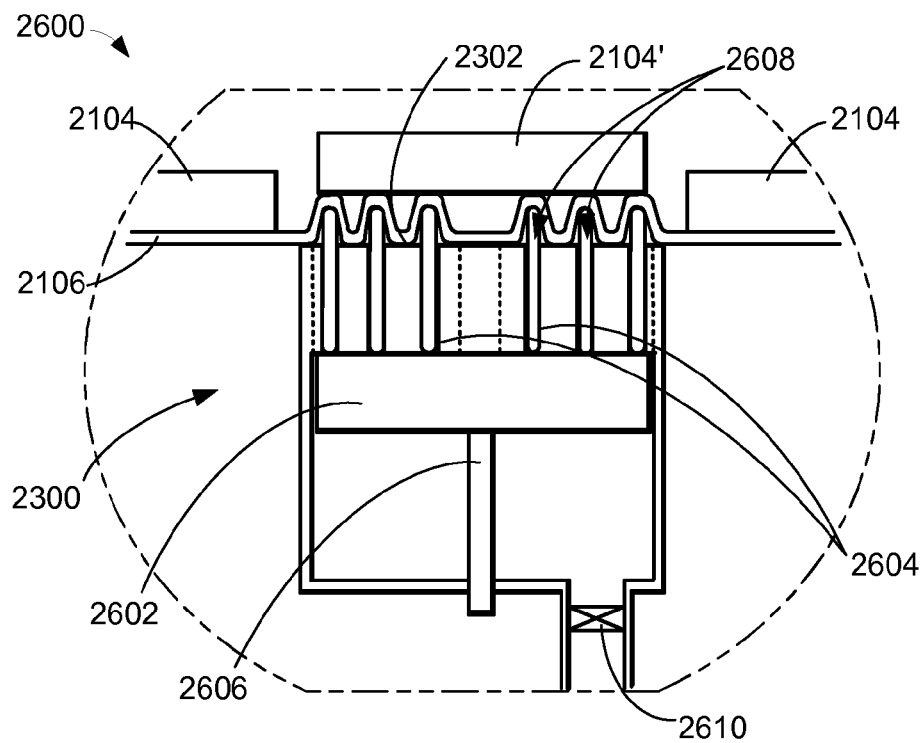
FIG. 30 is a view similar to FIG. 9, illustrating the final steps in separating the target chip from the adhesive material, just prior to lifting the target chip away therefrom.

Referring now to FIG. 30, therein is shown a view similar to FIG. 9, illustrating the final steps in separating the target chip 2104' from the adhesive material 2106, just prior to lifting the target chip 2104' away therefrom. The needles 2604 have been actuated and raised by the needle base extension 2606 and extend partly through the apertures 2608 to lift the target chip 2104' away from a top surface of the outer housing top 2302. The valve 2610 is maintained in an open condition so that vacuum continues to be applied beneath the adhesive material 2106. This causes the portions of the adhesive material 2106 not contacted or supported by the needles 2604 to continue to be held against the outer housing 2402 and thus to separate from the target chip 2104'. The target chip 2104' is thus almost completely peeled from the adhesive material 2106 and can then be readily and easily removed in known fashion for subsequent bonding to any preferred target object, such as a printed circuit board, a leadframe, other substrate, and so forth.

Following removal of the target chip 2104', the needle base extension 2606 is returned downwardly, the valve 2610 is closed to release the vacuum, and the outer housing 2402 and the semiconductor system 2300 are retracted downwardly away from the adhesive material 2106. The semiconductor system 2300 is then ready to successfully separate another of the chips 2104 from the adhesive material 2106 and is accordingly centered beneath another of the chips 2104, in the same manner as shown in FIG. 25. The process is then repeated Based on this disclosure, it will now be clear to one of ordinary skill in the art that a system for peeling semiconductor chips from tape has been discovered that significantly reduces the incidences of chip damage and fracture. The random failure of chips due to the stress of being pried from the adhesive tape by prior needle ejector configurations has been very substantially improved. The improvement is due to the unobvious initial release of the adhesive tape from the peripheral edges of the chips prior to the actuation of the needle ejector mechanism.

The central peeling nose of the present invention provides physical and structural support for the major, central portion of the chip body. This protects it from undue stresses, particularly the leverage stresses that can occur from forces applied at the chip periphery or edge, that are then amplified through a centrally positioned fulcrum such as an ejection needle. Instead, the risk of such forces at the chip edges is eliminated by the present invention by the initial or preliminary peeling of the tape from the peripheral edges of the chip prior to actuation of the ejection needles.

Figure 31:
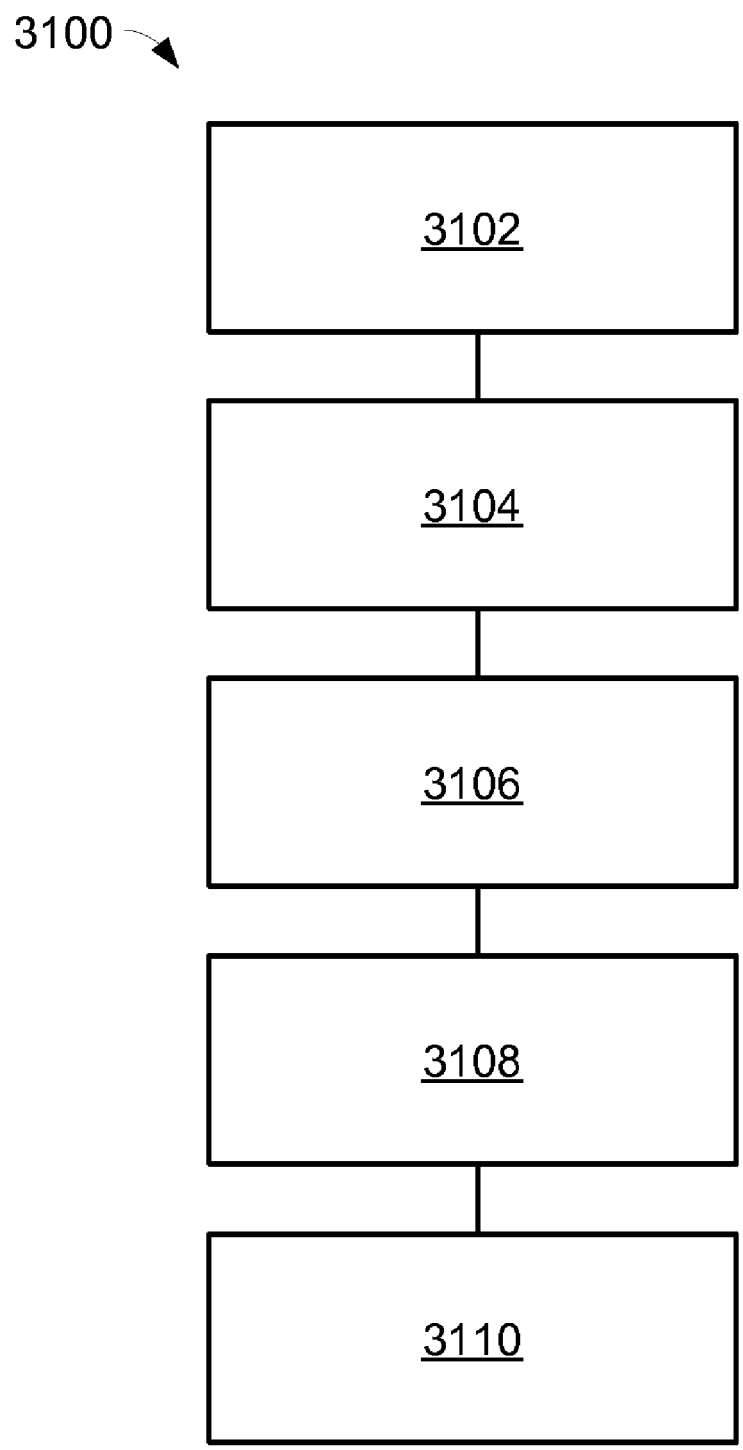
FIG. 31 is a flow chart of a semiconductor system for manufacturing the semiconductor system in an embodiment of the present invention.

Referring now to FIG. 31, therein is shown a flow chart of a semiconductor system 3100 for manufacturing the semiconductor system 100 in an embodiment of the present invention. The system 3100 includes providing an outer housing having an aperture on a top thereof in a block 3102; providing a magnet with a needle base extension in a block 3104; providing needles magnetically held to the magnet in a block 3106; applying a vacuum through the aperture to hold an adhesive material to the outer housing in a block 3108; and extending the needles through the aperture in the outer housing in a block 3110.

In greater detail, a system to provide the method and apparatus of the semiconductor system 100, in an embodiment of the present invention, is performed as follows:

1. Providing an outer housing having an aperture through a top thereof.
2. Providing a magnet in the outer housing driven by a needle base extension.
3. Providing needles magnetically held to the magnet.
4. Applying a vacuum through the aperture to hold an adhesive material and a chip to the outer housing.
5. Extending the needles through the aperture in the outer housing for lifting the chip and portions of the adhesive material from the outer housing while peeling other portions of the adhesive material from the chip.

Thus, it has been discovered that the semiconductor system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for operating a semiconductor system for peeling semiconductor chips from tape, comprising:
   providing an outer housing having outer features and an aperture on a top thereof;
   forming a base housing having base features below the outer housing, the base features protrude horizontally outward from the base housing into the outer features preventing rotational movement between the base housing and the outer housing;
   providing a magnet over the base housing;
   providing needles magnetically held to the magnet;
   applying a vacuum through the aperture to hold an adhesive material to the outer housing; and
   extending the needles through the aperture in the outer housing.

2. The method as claimed in claim 1 further comprising assembling a needle block over the magnet for positioning the needles.

3. The method as claimed in claim 1 wherein applying the vacuum includes opening a valve.

4. The method as claimed in claim 1 wherein providing the outer housing includes forming the outer features having a shape of the base features.

5. The method as claimed in claim 1 wherein providing the needles includes forming a magnetic needle base having the magnet with the needles thereover.

6. A method for operating a semiconductor system comprising:
   providing an outer housing having outer features and an aperture through a top thereof;
   forming a base housing having base features below the outer housing, the base features protrude horizontally outward from the base housing into the outer features preventing rotational movement between the base housing and the outer housing;
   providing a magnet over the base housing and in the outer housing;
   providing needles magnetically held to the magnet;
   applying a vacuum through the aperture to hold an adhesive material and a chip to the outer housing; and
   extending the needles through the aperture in the outer housing for lifting the chip and portions of the adhesive material from the outer housing while peeling other portions of the adhesive material from the chip.

7. The method as claimed in claim 6 further comprising:
   assembling a needle block over the magnet; and
   inserting the needles through the needle block for positioning the needles.

8. The method as claimed in claim 6 further comprising:
   providing a magnetic needle base;
   forming a needle base extension of the magnetic needle base; and
   forming a base opening of the base housing wherein the needle base extension is at least partially in the base opening for actuating the magnetic needle base.

9. The method as claimed in claim 6 wherein providing the outer housing includes forming the outer features with a shape and a size larger than the base features.

10. The method as claimed in claim 6 wherein providing the needles includes assembling the magnet provides a substantially planar horizontal position for the needles.

11. A semiconductor system for peeling semiconductor chips from tape, comprising:
- an outer housing having outer features and an aperture on a top thereof;
- a base housing having base features below the outer housing, the base features protrude horizontally outward from the base housing into the outer features preventing rotational movement between the base housing and the outer housing;
- a magnet over the base housing;
- needles magnetically held to the magnet;
- a vacuum source for applying a vacuum through the aperture to hold an adhesive material to the outer housing; and
- a needle base extension connected to the magnet for extending the needles through the aperture in the outer housing.

12. The system as claimed in claim 11 further comprising a needle block over the magnet for positioning the needle.

13. The system as claimed in claim 11 wherein the vacuum source includes a valve.

14. The system as claimed in claim 11 wherein the outer housing includes the outer features having a shape of the base features.

15. The system as claimed in claim 11 further comprising a magnetic needle base having the magnet with the needles thereover.

16. The system as claimed in claim 11 wherein:
- the outer housing has the aperture through the top thereof;
- the magnet is in the outer housing;
- the needles magnetically held to the magnet;
- the vacuum source applies the vacuum through the aperture to hold the adhesive material and a chip to the outer housing; and
- the needle base extension is connected to the magnet for extending the needles through the aperture in the outer housing for lifting the chip and portions of the adhesive material from the outer housing while peeling other portions of the adhesive material from the chip.

17. The system as claimed in claim 16 further comprising a needle block over the magnet wherein the needles are through the needle block for positioning the needles.

18. The system as claimed in claim 16 further comprising a needle base extension includes a base opening of the base housing wherein the needle base extension is at least partially in the base opening for actuating the magnetic needle base.

19. The system as claimed in claim 16 wherein the outer housing includes the outer features with a shape and a size larger than the base features.

20. The system as claimed in claim 16 wherein the magnet provides a substantially planar horizontal position for the needles.

* * * * *